(12) United States Patent
Divate et al.

(10) Patent No.: US 10,402,514 B2
(45) Date of Patent: Sep. 3, 2019

(54) MODELING AND SIMULATION OF DISTRIBUTED COMPUTING FRAMEWORKS

(71) Applicant: MityLytics Inc., Alameda, CA (US)

(72) Inventors: Hrishikesh Pradeep Divate, Pune (IN); Maneesh Kumar Singh, Alameda, CA (US); Sankalp Sah, Novato, CA (US); Scott Mordock, Saratoga, CA (US); Rakhi Mahto, Santa Clara, CA (US); Lakshmisha Nanjappachar, Alameda, CA (US)

(73) Assignee: MityLytics Inc., Alameda, CA (US)

( * ) Notice: Subject to any disclaimer, the term of this patent is extended or adjusted under 35 U.S.C. 154(b) by 229 days.

(21) Appl. No.: 15/654,310

(22) Filed: Jul. 19, 2017

(65) Prior Publication Data

US 2018/0025103 A1    Jan. 25, 2018

Related U.S. Application Data

(60) Provisional application No. 62/364,579, filed on Jul. 20, 2016.

(51) Int. Cl.
*G06F 13/10* (2006.01)
*G06F 17/50* (2006.01)
*G06Q 10/06* (2012.01)

(52) U.S. Cl.
CPC ....... *G06F 17/5009* (2013.01); *G06Q 10/063* (2013.01)

(58) Field of Classification Search
CPC .................................................. G06F 17/5009
USPC .......................................................... 703/21
See application file for complete search history.

(56) References Cited

PUBLICATIONS

Xu et al.: "Highly Accurate Simulations of Big-Data Cluster for System Planning and Optimization"; Intel White Paper; 8 pages; https://www.intel.com/content/www/us/en/cofluent/overview.html; Copyright 2016 Intel Corporation.

*Primary Examiner* — Hugh M Jones
(74) *Attorney, Agent, or Firm* — Fountainhead Law Group P.C.

(57) ABSTRACT

A method receives a second data set that is different from a first data set. A total number of operations based on the second data set using an operation estimator is generated. Also, an aggregate resource cost for the total number of operations based on the second data set using a resource cost estimator is generated. The method generates a simulation driver file including a sequence of operations from the total number of operations and a resource cost for each operation in the sequence of operations from the aggregate resource cost. The method simulates the sequence of operations by performing: requesting an amount of resource used by a respective operation on the simulated distributed computing system; reserving the amount of resource when available in the simulated distributed computing system without executing the respective operation; and calculating a time period associated with a simulated execution time of the respective operation.

20 Claims, 9 Drawing Sheets

MODELING AND SIMULATION OF DISTRIBUTED COMPUTING FRAMEWORKS

CROSS REFERENCE TO RELATED APPLICATIONS

The present disclosure claims priority to U.S. Provisional App. No. 62/364,579, entitled "Modeling and Simulation of Big Data Processing Frameworks on Cloud Infrastructure and Enterprise Data Centers", filed Jul. 20, 2016, the contents of which is incorporated herein by reference in its entirety.

BACKGROUND

Distributed computing systems are typically implemented in data centers located in multiple locations, each of which may provide one or more of computational resources, networking resources, and storage resources. Distributed computing systems continuously execute applications that are written using primitives or operations provided by the framework. The execution happens in a sequence of parallel operations across the distributed computing system.

The amount of resources that is allotted to run an application for a company in a distributed computing system can vary depending on how much the company purchases. At some point, the company may need to expand (or decrease) the amount of resources dedicated for the application. For example, the application may need more resources to run more efficiently. In this case, the actual hardware for the distributed computing system is provisioned and allocated to the application. The company then executes the application on the newly allocated resources in the distributed computing system. It is possible that the newly allocated resources may not exactly operate as the company expected. For example, the performance gain from the newly allocated resources may either be not as good or better than expected. In the not as good case, the company may need more resources, and in the better than expected, the company may be paying for too many resources. Either case is not an optimal use of capital for the company.

DETAILED DESCRIPTION

Figure 1:
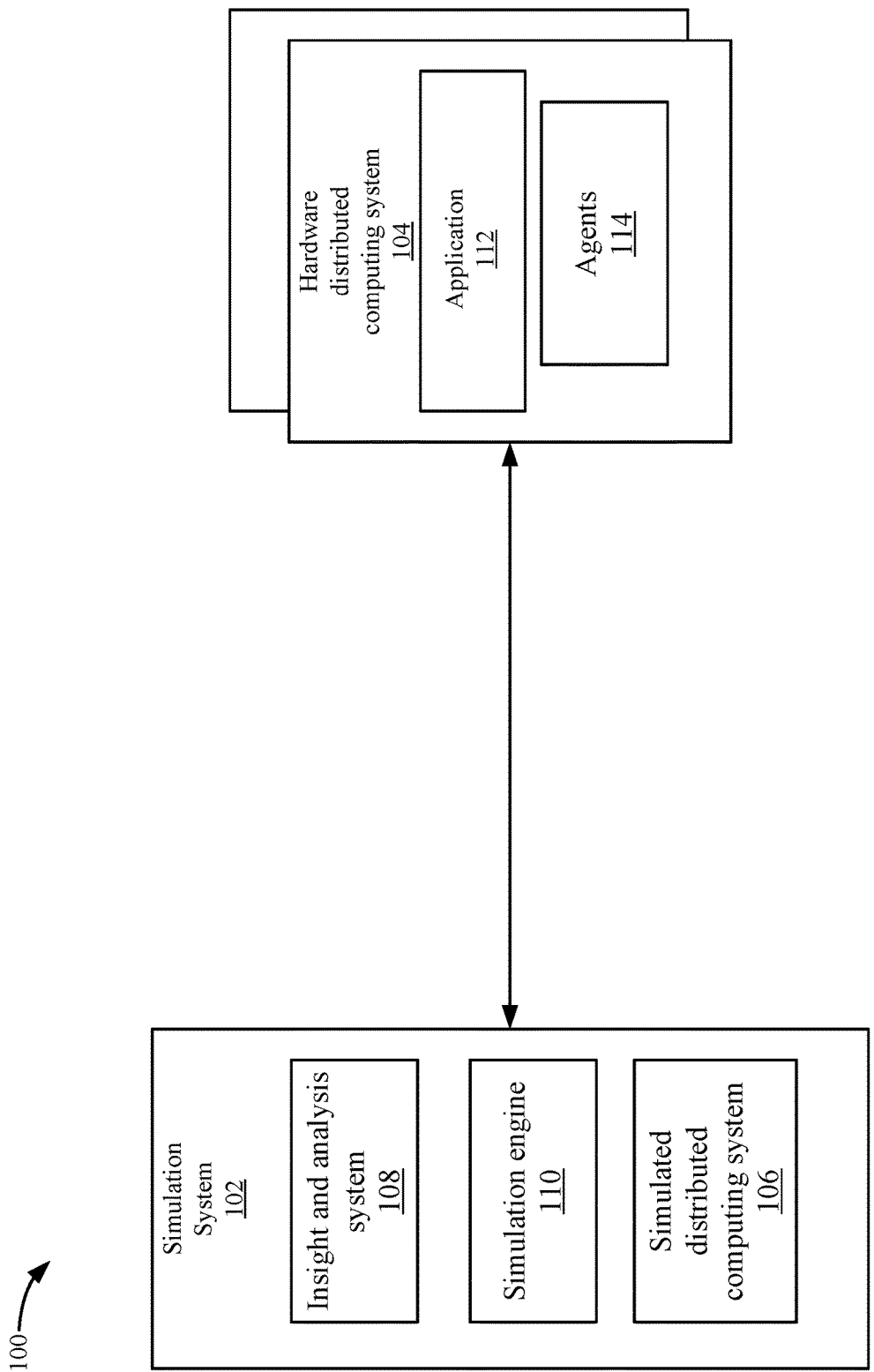
FIG. 1 depicts a simplified system for simulating a distributed computing system according to one embodiment.

Described herein are techniques for a modeling and simulation system. In the following description, for purposes of explanation, numerous examples and specific details are set forth in order to provide a thorough understanding of particular embodiments. Particular embodiments as defined by the claims may include some or all of the features in these examples alone or in combination with other features described below, and may further include modifications and equivalents of the features and concepts described herein.

A distributed computing system can be provisioned with different amounts of resources, such as computer processing units (CPUs), memory (e.g., random access memory), network, and storage. To efficiently provision the actual hardware for the distributed computing system, some embodiments simulate the execution of an application on a distributed computing system without actually having to provision the actual hardware for the distributed computing system or execute the instructions of the application. This saves time for a company and the simulation results also can be used to more efficiently provision the distributed computing system after the simulation is performed. The company can also test the application by provisioning different configurations of resources in the distributed computing system to determine which configurations will be acceptable or not for executing the application.

The simulation system can first execute the application on hardware of a distributed computing system. For example, a first amount of computing resources may be provisioned as hardware. The simulation system can then monitor and analyze the execution to train a model using estimators. In some examples, the application may be executing an algorithm that may be of a certain problem size. For example, the algorithm may be counting a number of unique first names for 100,000 students, where 100,000 students may be the problem size. The estimators may be used to estimate a number of operations that are performed when executing the application and also a resource cost for the operations. The resource cost may define how much resources are used by an operation. For example, an operation may use "A" amount of CPU units, "B" amounts of RAM, "C" amount of network bytes, and "D" amount of storage bytes, where A, B, C, and D are numbers.

Once the model is trained, the company may decide to change the problem size. For example, the problem size may be changed from counting the unique first names from 100,000 students to 100,000,000 students. Because 100,000 students was a lower number of students to count, the actual hardware that was provisioned in the distributed computing system could have been smaller and less costly. However, a move to a larger distributed computing system with more resources that is capable of predicting the problem size of 100,000,000 students may be needed. But, the company does not want to provision the hardware and test running the algorithm with 100,000,000 students because it may be costly and time-consuming. Accordingly, the simulation system allows a company to simulate the execution of the algorithm with the larger problem size on a simulated distributed computing system. In some embodiments, the actual operations are not executed by the simulated distributed computing system. Rather, the resource costs for the operations are used to determine how much resources are used by the simulated distributed computing system. This allows the simulation system to analyze the resource usage on the simulated distributed computing system without having to actually provision the hardware. Then, a company can test multiple different configurations of the simulated distributed computing system to determine an appropriate resource configuration for the actual hardware. Because the operations are not executed by the simulated distributed computing system, the simulation may run faster than if the operations were executed by actual hardware. Further, a simulation system can run multiple simulations in a faster amount of time because provisioning and computing on actual hardware does not need to be performed.

FIG. 1 depicts a simplified system 100 for simulating a distributed computing system according to one embodiment. System 100 includes a simulation system 102 and a hardware distributed computing system 104. Hardware distributed computing system 104 may include actual hardware, such as computing devices that include computer processing units (CPUs), memory (e.g., read access memory (RAM)), networking devices (switches, fabrics, and routers), and storage devices. The CPUs are processors that may execute instructions of an application. Each computing node may have one or more CPUs. The memory is used to store data while the application is executing. The networking devices transfer data, such as between devices in the hardware distributed computing system. The storage devices may persistently store data. In contrast to hardware distributed computing system 104, a simulated distributed computing system 106 may be simulated in simulation system 102 and not include any provisioned hardware that executes the instructions of application 112.

Simulation system 102 includes an insight and analysis engine 108 and a simulation engine 110. Insight and analysis engine 108 may monitor the execution of hardware distributed computing system 104 while system 104 is executing an application 112. For example, agents 114 may monitor the execution of application 112 and provide information for the execution back to insight and analysis engine 108. Insight and analysis engine 108 can then train estimators of a model that is used for the simulation.

Hardware distributed computing system 104 may be provisioned in an area, such as in a data center or multiple data centers. The provisioning provisions actual hardware in the data center. Hardware distributed computing system 104 may include different frameworks, which may be configured to execute different types of applications, such as batch frameworks, query frameworks, streaming frameworks, and messaging frameworks. Batch frameworks may include a map-reduce framework that may be a distributed programming paradigm that may use different phases, such as a map phase, a shuffle phase, or a reduced phase to perform operations. A query-based framework may be used to query components of distributed computing system 104, such as querying tables. A stream-based framework may use microbatches to split the data processing operation into resilient distributed datasets (RDDs) for processing. A messaging framework may be used to send messages in a live stream that are ingested and processed by hardware distributed computing system 104. Although these types of frameworks are described, other frameworks may be used and simulated.

Hardware distributed computing system 104 may be running an application 112. The application may include software code (e.g., instructions) that is executed, and when executed, uses resources of hardware distributed computing system 104. For example, CPUs, memory, network, and storage may be used during execution. In some embodiments, application 112 may be executing an algorithm. For example, the algorithm may be used to perform calculations on a data set, which may be of a certain size, in a distributed fashion. For example, the data set may include information for 100,000 students or information for 100,000,000 students. The data set may be processed by multiple different computing devices in parallel.

Agents 114 may be installed on hardware devices of hardware distributed computing system 104 to monitor the execution or may be installed on other devices to monitor the execution. For example, agents 114 may determine the type of operations being performed during the execution. In some examples, a number of operations is determined, such as the number of map operations, reduce operations, and shuffle operations for a batch framework. For other frameworks, agents 114 may determine different types of operations that are performed. Agents 104 may also determine the amount of resources used and the time taken to execute an operation. For example, as an operation is executed, agents 114 monitor the resources used by hardware distributed computing system 104 and correlate the usage to individual operations.

Insight and analysis engine 108 receives the operations and resource usage and can train estimators for estimating a number of operations and resources usage for application 112. The estimators may be used when the data set being analyzed by application 112 and/or the distributed computing system are changed. The data set may be changed to a different size, such as from information of 100,000 students to information of 100,000,000 students. The distributed computing system may be changed by changing the configuration or an amount of resources in the distributed computing system, such as changing the number of CPUs, amount of memory, amount or configuration networking, or amount or configuration of storage.

The estimators receive the changes and generate a simulator driver file for the algorithm of application 112 on hardware distributed computing system 104. As will be described in more detail below, a model including the estimators may be used to estimate a total number of operations and an aggregate usage of resources by the operations. Then, a simulator driver file can be created that includes a sequence of operations and a resource cost vector associated with each operation. The sequence of operations may be generated based on the target framework, such as a map operation, a reduce operation, and/or a shuffle operation. The resource cost vector may describe the amount of resources used by the operation in CPU, memory, network, and storage.

The estimators are trained based on the execution of application 112 on the hardware provisioned for hardware distributed computing system 104. However, a company may want to determine how a different data set may perform on a distributed computing system. For example, a company may want to determine whether or not a larger or smaller amount of resources in distributed computing system 104 may operate for the different problem size, or how a different configuration of a distributed computing system may perform. Accordingly, insight and analysis engine 108 generates a simulator driver file for the different problem size. The simulator driver file includes a different number of operations to solve the new problem based on the change in the data set. As will be described in more detail below, the estimators include a directed learning function that may be used to predict the number of operations for the changed data set. Additionally, the estimators in insight and analysis engine 108 may predict the amount of resources used by the operations using a second directed learning function that predicts the amount of resources used based on the change in the data set. For example, an aggregate number of resources that are used by the total number of operations is predicted. Then, insight and analysis system 108 distributes the aggregate number of resources across a sequence of operations as resource cost vectors. The simulator driver file includes the sequence of operations with resource cost vectors assigned to each operation.

Simulation engine 110 can then configure simulated distributed computing system 106 for a simulation. The configuration may adjust a type of framework used, an amount of resources, and also other characteristics, such as resource type. For example, a target hardware configuration may specify a number of compute nodes and a number of CPU cores in each compute node. For example, a compute node may be a computing device that includes one or more CPUs. The target hardware configuration also includes a number of storage devices, capacity, and type. For example, the capacity may be the number of storage bytes available and the type may include different storage types, such as flash, distributed storage, hard disk drives (HDDs), and solid state drives (SSDs). The target hardware configuration also includes the amount of network bandwidth available in bytes and also the type of connectivity, which may be a storage area network or other type of connectivity. Memory may be specified in the type of memory and the amount on each compute node. For example, an amount of RAM may be specified for each compute node.

Simulation engine 110 receives the new simulation driver file and can analyze the performance of application 112 on simulated distributed computing system 106. For example, simulation engine 110 may simulate the resources used on simulated distributed computing system 106 for each operation. Simulation engine 110 can analyze the performance of application 112 based on the changed data set on simulated distributed computing system 106 without having to execute the operations. Simulation engine 110 uses the resource cost vector for each operation to determine resource usage and measures the time that would elapse if that operation were to execute for simulation purposes, but does not execute the operation. Not having to execute the operation saves processing power also as no processing cycles are needed for the application to execute the operation. The time that elapses for the operation may be determined based on the training of the model. For example, simulation engine 110 can determine that operations take X amount of time to execute based on the execution of the operations on hardware distributed computing system 104. Then, a more powerful resource that is simulated may execute the operation faster and this time is estimated by simulation engine 110. Simulation engine 110 may measure the elapsed time during the simulation to determine when to release the resources used by the operation for another operation.

Simulation engine 110 uses the resource cost vectors to simulate the amount of resources being used by the operations on simulated distributed computing system 106. This provides simulation engine 110 with a picture of how much resources are used. The company can then determine a desired configuration of a distributed computing system based on simulations of different configurations of simulated distributed computing system 106 without having to provision actual hardware. This provides a cost effective and efficient method for determining the size of hardware distributed computing system 104 without provisioning actual hardware. Additionally, changes to the size of simulated distributed computing system 106 may be easily performed to test different sizes of the distributed computing system. Also, the data set can be changed multiple times and simulated to determine the appropriate provisioning of hardware for different data sets.

Insight and Analysis Engine 108

Figure 2:
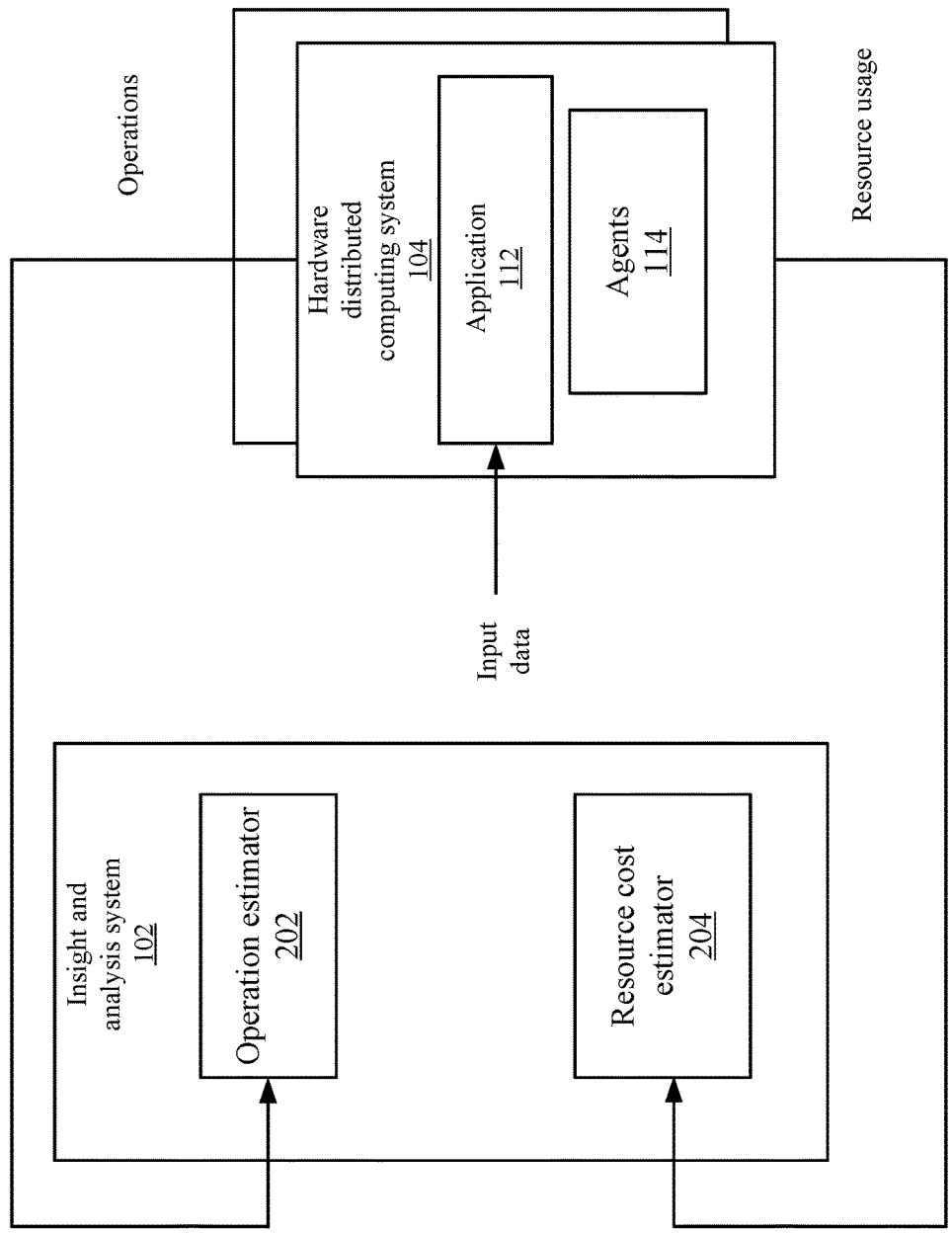
FIG. 2 depicts a more detailed example of an insight and analysis engine for training estimators according to some embodiments.

FIG. 2 depicts a more detailed example of insight and analysis engine 108 for training estimators according to some embodiments. Insight and analysis engine 108 includes an operation estimator 202 and a resource cost estimator 204.

Operation estimator 202 can receive information from the execution of operations by application 112 on hardware distributed computing system 104. Input data, such as a data set, may be input into application 112 for processing. Then, agents 114 send information on which operations are executed in which certain order. For example, agents 114 may send a number of map, reduce, and shuffle operations to operation estimator 112 that were executed and in which order. Operation estimator 112 then can train itself based on the input features to the estimator and expected targets. For example, coefficients of a network of operation estimator 112 are generated from the training information. The coefficients allow operation estimator 112 to estimate a total number of operations of each type that are needed to process a different data set. Each estimator function is individually trained by working on training data that is curated in an automated fashion by automatically determining input data that yields acceptable training data. The quality of training data is measured by using a cross validation score and validated with data from the training runs. This results in algorithms that are trained very fast, with only 10-20 runs of a given application. 25% of total data is used to train and 75% is used to validate.

Resource cost estimator 204 may receive information from agents 114 regarding the usage of resources for operations in hardware distributed computing system 104. The resources used may be from the use of CPU, memory, network, and storage for each operation. Resource cost estimator 204 can input the resource usage to train coefficients of the estimator to output an amount of resources that are used by different data sets. For example, a data set of a first size (or multiple sizes) with expected results is used to train the estimator such that the estimator can estimate resource usage for any data set.

Figure 3:
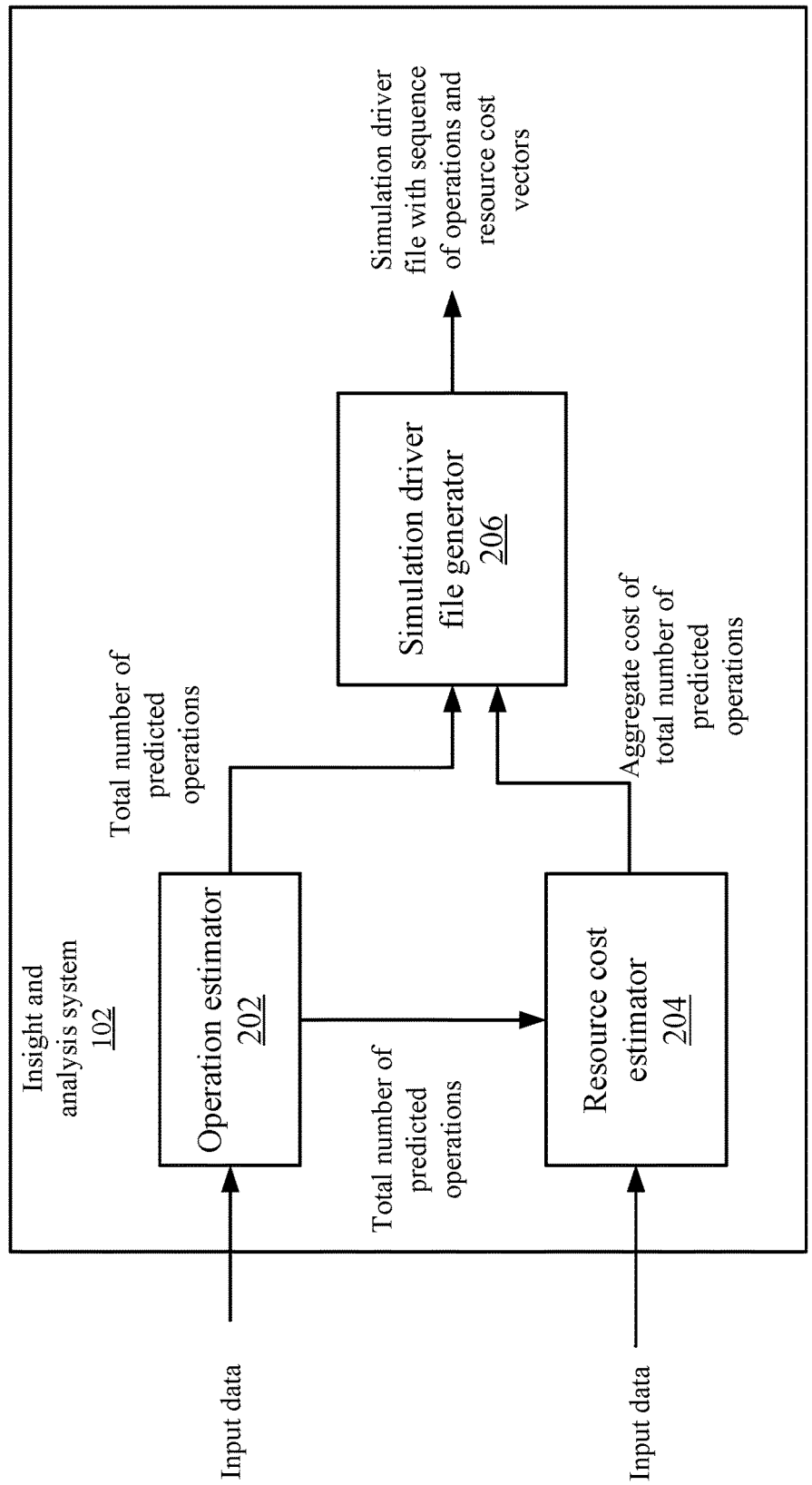
FIG. 3 depicts a more detailed example of the insight and analysis engine for generating a simulation driver file according to some embodiments.

The training of operation estimator 102 and resource cost estimator 204 may train a model that can be used to generate a simulation driver file for simulating the execution of a new data set on simulated distributed computing system 106. FIG. 3 depicts a more detailed example of insight and analysis engine 108 for generating a simulation driver file according to some embodiments.

Operation estimator 102 receives input data, such as a changed data set. As mentioned above, information for 100,000,000 students may be received. Operation estimator 102 can then estimate the total number of operations needed to process the data set. For example, a total number of each type of operation is estimated, such as a total number of map, reduce, and shuffle operations.

Resource cost estimator 204 can generate the resource cost for the operations. For example, resource cost estimator 204 receives input data, such as the changed data set. Then, resource cost estimator 204 can generate an aggregate amount of resources used by the operations needed to process the changed data set. The aggregate amount is all of the resources used, such as 1 gigabyte of storage may be used by all of the operations in total. Although an aggregate amount of resources may be used, the resources for each operation may also be predicted. However, taking the aggregate amount of resources and distributing the resources across the operations may be faster than individually deriving the operations.

Once the aggregate cost is determined, a simulation driver file generator 206 receives the total number of operations and the aggregate resource cost. Simulation driver file generator 206 then can generate a sequence of operations from the total number of operations and assign a resource cost vector to each operation. Simulation driver file generator 206 can generate the sequence of operations from the total number of operations based on logic on how to execute operations on the framework being used. For example, if a map reduce framework is used, the total number of map, reduce, and shuffle operations can be generated in a sequence of performing map, reduce, and shuffle operations on a distributed environment. For example, if the data set is partitioned into n=4 buckets for example, a map operation on each of the four buckets is applied where names starting with the A-F letters and their count go into one array, G-M into another array and so forth. Now the arrays of names starting with A-F in each of the four buckets are shuffled so the names land in one bucket, the same is done with G-M and so forth so now there are four buckets with bucket #1 having names from A-F, bucket #2 contains names from G-M, and so forth. A map operation can count the number of unique names in each bucket in a parallel fashion (map) and get the count of unique names across the buckets by a reduce operation. Simulation driver file generator 206 can use this logic to determine the sequence of operations from the total amount of operations. The sequence of operations follows the pattern map, shuffle, reduce, which can be repeated and the number of map operations and shuffle operations is a multiple of the number of executor/worker processes. The reducers are typically a logarithm base n of map operations where n is the number of executors/workers.

For the sequence of operations, simulation driver file generator 206 can generate a resource cost vector, which may be: $Roperation_{cost}$ (CPU units, memory, network bytes, storage bytes). CPU units may be CPU time (e.g., the number of CPU cycles used); memory may be the amount of memory used by the operation; network bytes may be the number of bytes that are transferred on the network for the operation; and storage bytes may be the amount of storage used by the operation. In some embodiments, in a map reduce framework, a resource cost vector for a map operation is $Rmap_{cost}$ (CPU units, memory, network bytes, storage bytes); the resource cost vector for a reduce operation is $Rreduce_{cost}$ (CPU units, memory, network bytes, storage bytes); and the resource cost vector for a shuffle operation is $Rshuffle_{cost}$ (CPU units, memory, network bytes, storage bytes). Resource cost generator 206 may input the value for CPU units, memory, network bytes, and storage bytes for each type of operation.

Model generator 206 can assign resources from the aggregate number of resources to each operation. The aggregate resource usage may be learnt from observing the application run in hardware distributed computing system 104 and using the same partitioning scheme. Also, a customized partitioning scheme may be specified, which can be uniform (e.g., evenly distributed) or random. The allocation may also be based on how the data set is partitioned. For example, resources may be allocated to different buckets of names either uniformly, randomly, or based on the number of names in each bucket.

Simulator driver file generator 206 outputs the simulator driver file, which includes a sequence of operations, such as a sequence of map operations, reduce operations, and shuffle operations, and a resource cost vector associated with each operation. The sequence of operations is predicted based on the execution of application 112 on hardware distributed computing system 104.

Figure 4A:
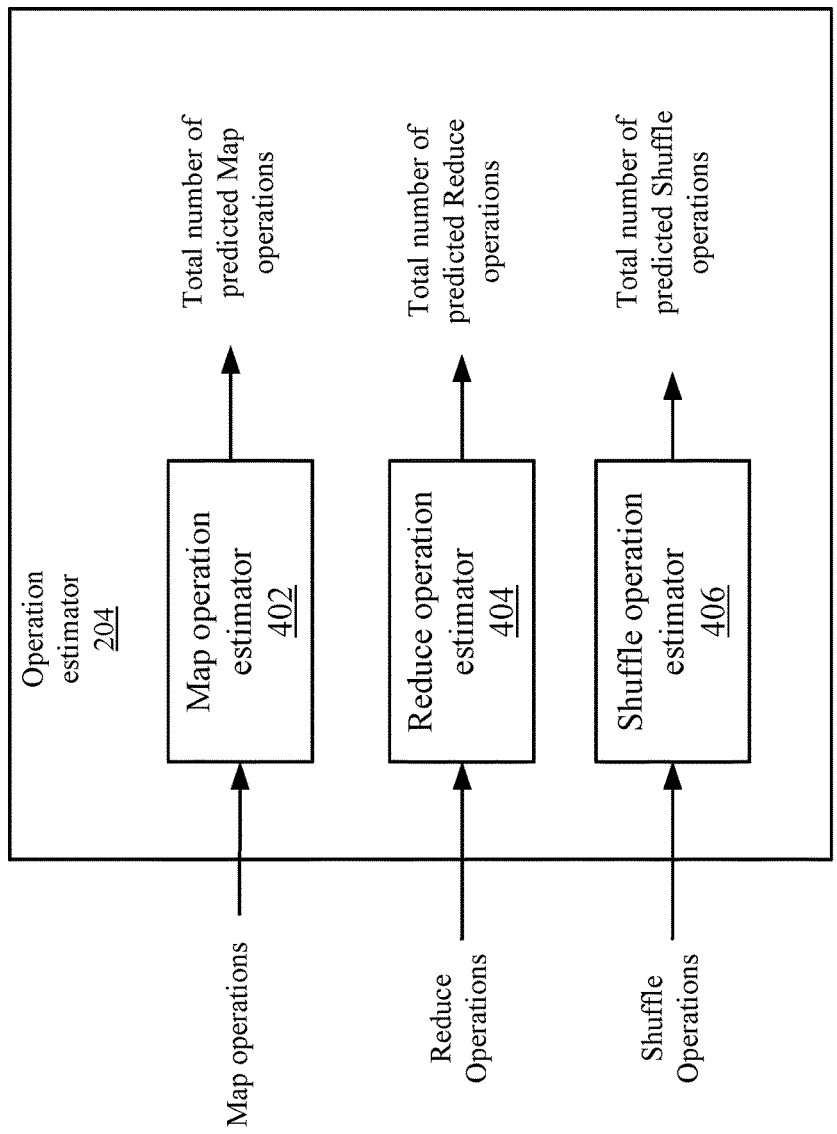
FIGS. 4A and 4B depict a more detailed example of the insight and analysis engine for generating a new model for a map reduce framework according to one embodiment.
Figure 4B:
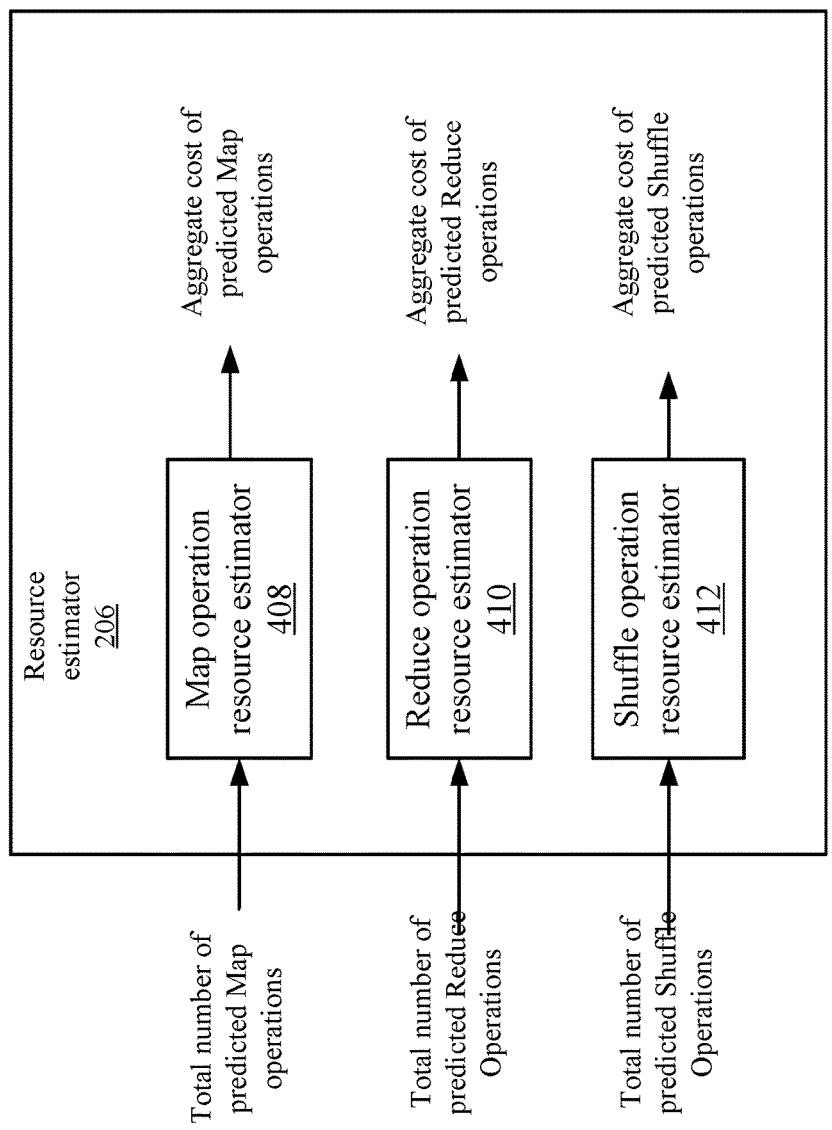

In some examples, a map reduce framework may be used. FIGS. 4A and 4B depict a more detailed example of insight and analysis engine 108 for generating a new model for a map reduce framework according to one embodiment. In FIG. 4A, operation estimator 204 includes a map operation estimator 402, a reduce operation estimator 404, and a shuffle operation estimator 406. Each estimator may include functions that can determine the number of operations of each type for a given data set. The functions may be in the form of learning networks that were trained as described above. Each estimator then uses the functions for a given data set to determine the number of operations of each type. For example, the function may be equal to: number of operations=Foperation(problem size), where number of operations is the number of operations executed for the data set and Foperation is the function and problem size is the new problem size of the data set. The Foperation function can predict the number of operations based on the problem size. Specifically, for a map-reduce framework, the following functions may be used:

Nummaps=$F$map(problem size);

numreduces=$F$reduce(problem size);

and numshuffles=$F$shuffles(problem size), where nummaps=the number of map operations, numreduces=the number of reduce operations, and numshuffles=the number of shuffle operations. Fmap, Freduce, and Fshuffles are different functions of map operation estimator 402, reduce operation estimator 404, and shuffle operation estimator 406, respectively, that are used to determine the number of map operations, reduce operations, and shuffle operations.

Once the total number of map operations, reduce operations, and shuffle operations are determined, an aggregate cost is determined for each type of operation. In FIG. 4B, resource estimator 206 includes a map operation resource estimator 408, a reduce operation resource estimator 410, and a shuffle operation resource estimator 412. Each estimator may include functions that can determine the aggregate number of resources for each type of operation for a given data set. The functions may be in the form of learning networks that were trained as described above.

Resource estimator 206 can then adjust the aggregate resource cost for the operations based on the number of operations. For example, each estimator 408, 410, and 412 uses fitting functions to predict the aggregate resource usage for the new problem size. The following functions may be used for the resources:

CPU units=$F$CPU(problem size);

Memory=$F$memory(problem size);

Network=$F$network(problem size);

Storage=$F$storage(problem size), where CPU units=CPU time, Memory=the amount of memory used, Network,=the amount of network bytes used, and Storage=the amount of storage used. FCPU, Fmemory, Fnetwork, and Fstorage are different functions that are included in each of map operation resource estimator 408, reduce operation resource estimator 410, and shuffle operation resource estimator 412. Each function for CPU, memory, network, and storage may be generated based on the execution of application 112 on hardware distributed computing system 104. The functions may be different for each resource depending on the use of the resources during the execution of application 112 and for each type of operation.

The output of map operation resource estimator 408, a reduce operation resource estimator 410, and a shuffle operation resource estimator 412 is the aggregate resource cost for each type of operation. Then, the aggregate resource cost can be divided across each type of operation. For example, model generator 206 may assign resource costs to each of the resources in the resource vectors by getting data points in the coordinate space by fitting functions to the resource usage of each operation. The aggregate cost of each resource is split across operations to come up with a sequence of operations with associated resource vectors. For example, given the total number of CPU units used for the problem size, the number of CPU units may be split across the number of operations being performed for the problem size.

Simulation

Figure 5:
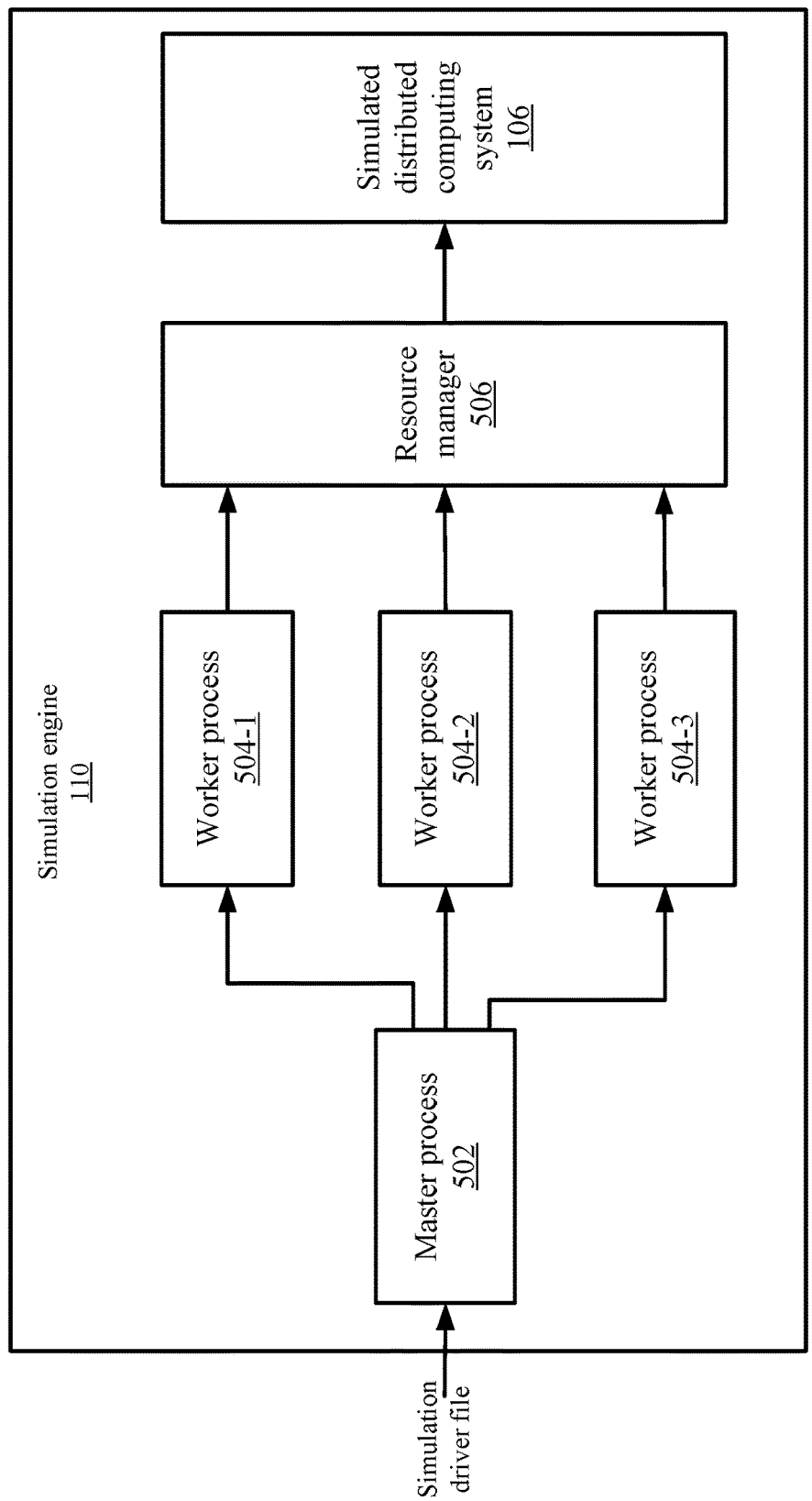
FIG. 5 depicts an example of a simulation engine according to one embodiment.

Once the data set has been changed and the new simulation driver file is generated, then the new simulation driver file may be simulated on simulated distributed computing system 106. FIG. 5 depicts an example of simulation engine 110 according to one embodiment. Simulation engine 110 receives a target hardware configuration for simulated distributed computing system 106. Resource manager 506 may receive the target hardware configuration and can generate a simulated distributed computing system 106. For example, resource manager 506 may configure the number of compute nodes, memory in each compute node, storage devices, and network connectivity between compute nodes.

Master process 502 receives the simulation driver file and may simulate events from the simulation driver file, such as simulating the operations. When master process 502 encounters an operation in the new model, master process 502 assigns the operation to one of worker processes 504-1-504-3. Worker processes 504 may operate in parallel to access resource manager 506. For example, each worker process 504 may be processing buckets (e.g., a bucket of names) for a map operation.

Worker process 504 takes the operation that was assigned to it and then makes a call into resource manager 506 to reserve the resources for the operation. Worker process 504 may use the resource cost vector to determine how much resources to request from resource manager 506. For example, if the operation uses 100 megabytes of memory, then worker process 504 requests 100 megabytes of memory from resource manager 506.

When an operation is received by resource manager 506, resource manager 506 attempts to reserve a resource in simulated distributed computing system 106 for the operation. For example, any combination of CPU, memory, network, and storage may be reserved in an associated amount. If simulated distributed computing system 106 does not have one or more of the resources available, then resource manager 506 may indicate that the operation is stalled and cannot be performed at that time. In this case, the operation may need to wait until one or more of the resources become available in simulated distributed computing system 106, such as when another operation finishes executing.

In a distributed computing environment, operations may be executed in a distributed fashion. For example, master process 502 may send different map operations for different name buckets to different worker processes 504 or multiple worker processes 504 may be operating on portions of an operation (e.g., a map operation). The resources for these operations may then be reserved in parallel. In some examples, simulation engine 110 simulates the distributed nature of the map reduce framework using worker processes 504.

The above process continues as master process 502 encounters operations in the new simulation driver file and assigns the operations to worker processes 504. The operations may execute asynchronously or synchronously. For example, the worker process 504 schedules a map operation that requires 100 MB of RAM. If that much RAM is not available, then the operation will be queued to resource manager 506 and the worker process 504 will retrieve the next operation.

The resources that are modeled can be one of several types depending on the underlying CPU configuration, which maybe one of x86, Advanced RISC Machines (ARM), graphics processing unit (GPU); memory configuration, which may be double data rate (DDR) RAM (e.g., one of DDR3 or DDR4), network configuration, which may be how many network interface cards are used and associated bandwidth (e.g., 1 Gb, 10 Gb, 25 Gb, 40 Gb); and storage architecture configuration, which may be one of directly attached, storage area network (SAN), or tertiary storage and different technologies (HDD, SSD, non-volatile memory (NvMe)—flash). The latency and throughput of each kind of memory and storage is different and the time of each operation expressed in amount of memory will take a different amount of time after the requests for these resources are scheduled. The time is advanced in the simulation for the amount of time the operation waits for these resources and then the time is advanced by the amount of time t it would take given the throughput and latency. Simulation engine 110 determines the simulation time based on:

$$t=\text{time for resource to be available}+\text{throughput}/\text{amount of memory}+\text{latency}.$$

The time for resource to be available is the time it takes for the resource to become available after the request for the resource, the throughput/amount of memory is the time the operation takes to execute, and the latency is any delay during processing. For CPU time, simulation engine 110 advances the time in the simulation by time t every time the CPU is requested where t is expressed as t=scheduling delay+time waiting for CPU+CPU slice time, where scheduling delay is the wait to for a CPU to become available after the request is made for the resource, the time waiting for the CPU is the latency of the CPU, and the CPU slice time is processing time of the operation.

For networking resources requested as part of the resource cost vector of an operation, simulation engine 110 advances the time in the simulation as $$t=\text{time to acquire a network interface card}+\text{setup time}+\text{link bandwidth}/\text{amount of data transfer},$$

where time to acquire the network interface card is the time for the card to become available after making the request for the resource, the setup time is the time to configure the connection, and the link bandwidth/amount of data is the time to transfer the data based on the link bandwidth and the amount of data. The event based simulation ends when all operations, which are essentially events, are scheduled and processed. The time in the simulation is advanced for every event that is processed.

Figure 6:
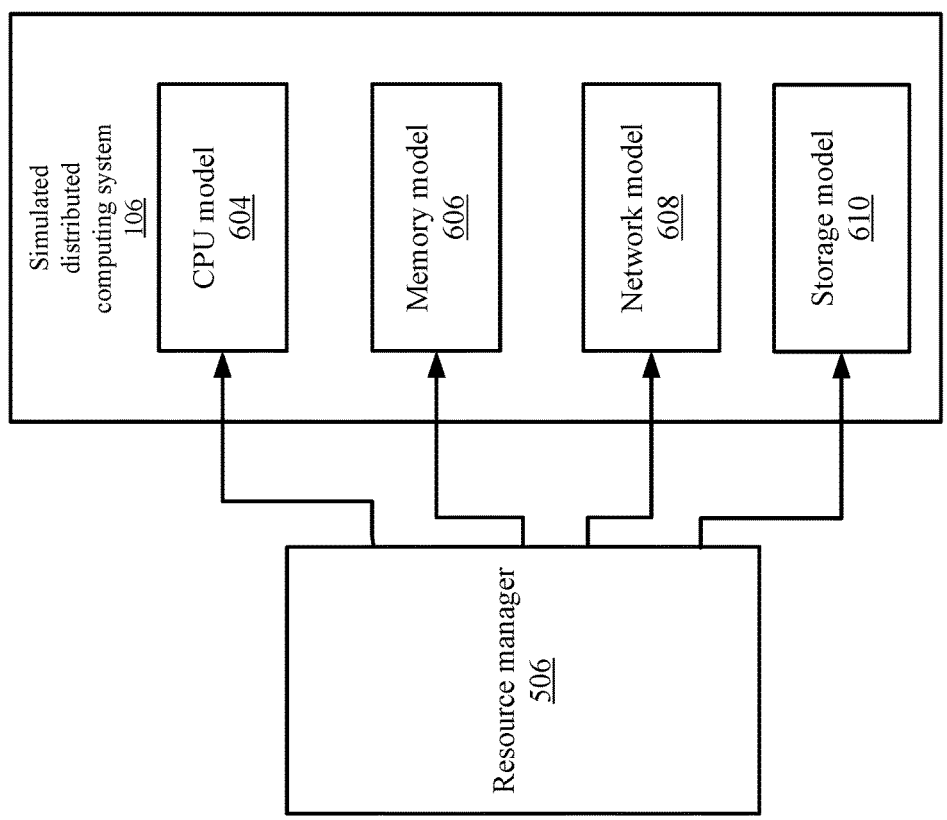
FIG. 6 shows a more detailed example of a simulated distributed computing system according to some embodiments.

FIG. 6 shows a more detailed example of simulated distributed computing system 106 according to some embodiments. In simulated distributed computing system 106, the resources may be modeled as including a number of resources that are available. The actual hardware may not be simulated. That is, the actual storing of data in memory is not simulated. Rather, just the reserving of the memory needed for an operation.

A CPU model 604 may model CPUs. Each CPU may be modeled as a resource with multiple units (e.g., cores). Each core can be independently assigned to a CPU component of the resource cost vector for an operation.

A memory model 606 may model the memory. The memory may be modeled as a container from which memory is drawn to service the memory component of the resource cost vector for each operation.

A network model 608 may model the network configuration. The network may be modeled as a resource having one or more independent network entities that can be scheduled to work on the network element of the resource cost vector. The network entities may be reserved for an operation.

A storage model 610 may model the storage configuration. Storage may be modeled as storage devices that can be used to store data. Different types of storage devices may be used and reserved as resources. Storage model 610 may simulate different types of storage, such as an HADOOP file system (HTFS), peer-to-peer, and/or a type of physical storage (HDD, SDD, flash). The transactions for storage systems are simulated from the resource cost vectors. Storage model 610 can model the request by reserving resources for the data stores that may be dependent upon the different configurations that are simulated. The input parameters of a resource cost vector may include the type of storage system and the type of underlying storage system that are used by the operation.

Resource manager 506 then can check simulated distributed computing system 106 for resource availability. For example, resource manager 506 checks CPU model 604, memory model 606, network model 608, and storage model 610 to determine if resources are available when the resources are requested by an operation. For example, at different times during execution of application 112, the resources may be available. As more operations are used, resources get exhausted, or at certain times during execution, if too many operations are being executed, stalls result because resources are not available, such as there might not be a CPU core available. For example, resource manager 506 may determine whether there is a CPU core available in a compute node for executing the operation. If so, then resource manager 506 may assign the operation to a CPU core in CPU model 604. If there is not a CPU core available, then resource manager 506 may issue a stall. In either case, resource manager 506 may issue a response to worker process 504. The response may include whether the resources were allocated to the operation or a stall was encountered. Worker process 504 can then provide a response to master process 502 indicating whether the request was successful or not.

It is noted that the operation is not executed by resource manager 506 or simulated distributed computing system 106. Rather, resource manager 506 determined whether or not the resources could be allocated. This speeds up the simulation as the operation does not need to be executed, rather the models for resource manager 506 are used to determine whether or not resources can be allocated to an operation.

Figure 7:
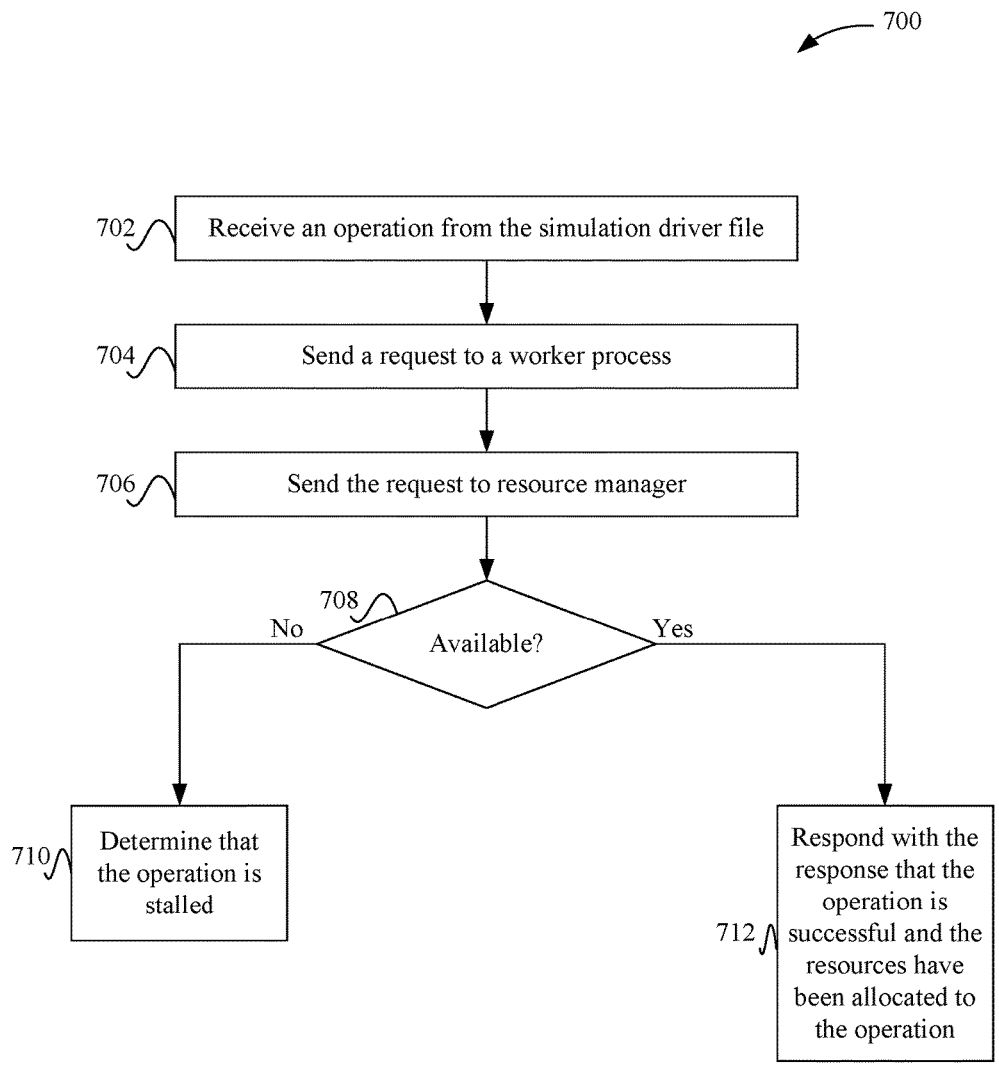
FIG. 7 depicts a simplified flowchart of a method for performing the simulation on the new model according to some embodiments.

FIG. 7 depicts a simplified flowchart 700 of a method for performing the simulation on the new model according to some embodiments. At 702, simulation engine 110 receives an operation from the new simulation driver file. For example, a sequence of operations may be fed to master process 502.

At 704, master process 502 sends a request to a worker process 504. At 706, worker process 504 then sends the request to resource manager 506.

At 708, resource manager 506 may determine if the one or more resources are available. For example, resource manager 506 may check resource models 604, 606, 608, and 610 to determine if resources are available for the operation.

If a resource that is requested is not available, at 710, resource manager 506 determines that the operation is stalled. That is, the operation must wait until a resource becomes available to be executed. However, it is noted that simulated distributed computing system 106 does not actually execute the operation, but rather just determines the resource usage.

At 712, if a resource is available, resource manager 506 responds with the response that the operation is successful and the resources have been allocated to the operation and the simulated execution time. Simulation engine 110 may record the simulated time that each operation takes to execute and resources used, and provide an analysis of the operation.

Other Distributed Framework Examples

Although a batch framework, such as a map reduce framework, as described above, other frameworks may be used. For example, a query-based framework simulation may be performed. To perform a query-based framework, the scale of tables is specified. For example, the scale of the table may be the size of the table, such as a scale of 1 translates to a table size of 1 gigabyte. Each database query may have a scale of tables. The model specifies a number of joins. Then, the size of the tables being joined is specified and, optionally, the size or number of rows returned can be specified. The model then generates a query execution plan. The execution plan can be parsed to determine queries. Then, the target hardware can be specified, such as the number of compute nodes; number of CPU units on each compute node; the amount and type of storage; the type of network with bandwidth; the number of network interfaces on each cluster or in each compute node; the amount of memory on each node; and the date of storage node being used.

Simulation engine 110 can then simulate the query-based framework by reducing the queries to underlying map reduce operations that have been assigned resource cost vectors. These operations can then be input into simulation engine 110 as a sequence of operations. The different number of joined tables, returned rows affect the number of map-reduce operations. This is where simulation can help developers of queries and designers of data models where the users can input a query's characteristics on a given data model and receive the running time and resources consumed. Then the developers can change the data model and try again without ever running the data model on real hardware thus reducing amount of time and money spent.

A stream-based framework can also be simulated. The stream-based framework includes micro batches that may be a resilient distributed data set (RDD). The model for a stream-based framework may be prepared as a sequence of micro batches. Each micro batch may include a sequence of operations that may be reduced to a type of transmission, action, or shuffle. Each operation may be assigned a resource cost vector.

In a live-stream processing framework, when messages are adjusted, they are organized into streams and processed. A model may be generated with a sequence of messages arriving at different rates, sizes, and with different inter-arrival times. These messages are then segregated into different streams that are processed by simulation engine 110. Each message may be dispatched to a worker process 504 for processing. Then, each worker process 504 can request the resources to process the message as described above.

Accordingly, simulation system 102 may simulate different distributed computing systems that can be used for different problem sizes. A company can change the problem size and determine how the change will perform on different distributed computing systems. Because operations are not actually executed on the simulated distributed computing systems, the simulation may run faster. Also, because the actual hardware does not need to be provisioned for the simulation, simulation system 102 may provide a result to the company faster as to whether or not the allocated resources of the simulated distributed computing system can handle the new problem size or not.

System

Figure 8:
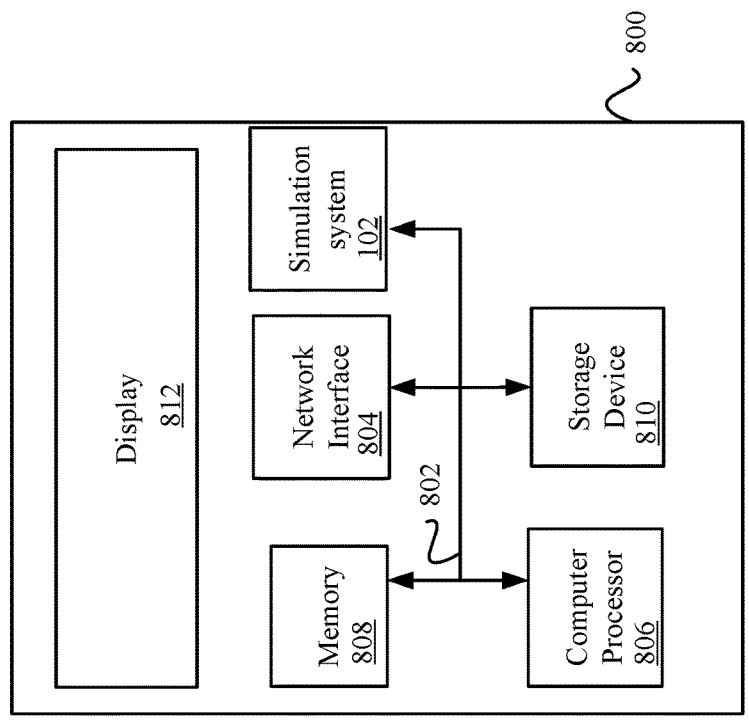
FIG. 8 illustrates an example of a special purpose computer system configured with a simulation system according to one embodiment.

FIG. 8 illustrates an example of a special purpose computer system 800 configured with simulation system 102 according to one embodiment. Only one instance of computer system 800 will be described for discussion purposes, but it will be recognized that computer system 800 may be implemented for other entities described above, such as hardware distributed computing system 104.

Computer system 800 includes a bus 802, network interface 804, a computer processor 806, a memory 808, a storage device 810, and a display 812.

Bus 802 may be a communication mechanism for communicating information. Computer processor 806 may execute computer programs stored in memory 808 or storage device 808. Any suitable programming language can be used to implement the routines of particular embodiments including C, C++, Java, assembly language, etc. Different programming techniques can be employed such as procedural or object oriented. The routines can execute on a single computer system 800 or multiple computer systems 800. Further, multiple computer processors 806 may be used.

Memory 808 may store instructions, such as source code or binary code, for performing the techniques described above. Memory 808 may also be used for storing variables or other intermediate information during execution of instructions to be executed by processor 806. Examples of memory 808 include random access memory (RAM), read only memory (ROM), or both.

Storage device 810 may also store instructions, such as source code or binary code, for performing the techniques described above. Storage device 810 may additionally store data used and manipulated by computer processor 806. For example, storage device 810 may be a database that is accessed by computer system 800. Other examples of storage device 810 include random access memory (RAM), read only memory (ROM), a hard drive, a magnetic disk, an optical disk, a CD-ROM, a DVD, a flash memory, a USB memory card, or any other medium from which a computer can read.

Memory 808 or storage device 810 may be an example of a non-transitory computer-readable storage medium for use by or in connection with computer system 800. The non-transitory computer-readable storage medium contains instructions for controlling a computer system 800 to be configured to perform functions described by particular embodiments. The instructions, when executed by one or more computer processors 806, may be configured to perform that which is described in particular embodiments.

Computer system 800 includes a display 812 for displaying information to a computer user. Display 812 may display a user interface used by a user to interact with computer system 800.

Computer system 800 also includes a network interface 804 to provide data communication connection over a network, such as a local area network (LAN) or wide area network (WAN). Wireless networks may also be used. In any such implementation, network interface 804 sends and receives electrical, electromagnetic, or optical signals that carry digital data streams representing various types of information.

Computer system 800 can send and receive information through network interface 804 across a network 814, which may be an Intranet or the Internet. Computer system 800 may interact with other computer systems 800 through network 814. In some examples, client-server communications occur through network 814. Also, implementations of particular embodiments may be distributed across computer systems 800 through network 814.

Particular embodiments may be implemented in a non-transitory computer-readable storage medium for use by or in connection with the instruction execution system, apparatus, system, or machine. The computer-readable storage medium contains instructions for controlling a computer system to perform a method described by particular embodiments. The computer system may include one or more computing devices. The instructions, when executed by one or more computer processors, may be configured to perform that which is described in particular embodiments.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The above description illustrates various embodiments along with examples of how aspects of particular embodiments may be implemented. The above examples and embodiments should not be deemed to be the only embodiments, and are presented to illustrate the flexibility and advantages of particular embodiments as defined by the following claims. Based on the above disclosure and the following claims, other arrangements, embodiments, implementations and equivalents may be employed without departing from the scope hereof as defined by the claims.

What is claimed is:

1. A method comprising:
  receiving, by the computing device, a second data set that is different from a first data set;
  generating, by the computing device, a total number of operations based on the second data set using an operation estimator, wherein the operation estimator was trained using information from a hardware distributed computing system that executed an algorithm of an application processing the first data set on a set of hardware devices;
  generating, by the computing device, an aggregate resource cost for the total number of operations based on the second data set using a resource cost estimator that was trained using the information from the hardware distributed computing system;
generating, by the computing device, a simulation driver file including a sequence of operations from the total number of operations and a resource cost for each operation in the sequence of operations from the aggregate resource cost based on logic associated with executing the algorithm of the application; and
simulating, by the computing device, the sequence of operations by performing:
requesting, by the computing device, an amount of resource used by a respective operation on s simulated distributed computing system, the amount of the resource based on the resource cost of the respective operation;
reserving, by the computing device, the amount of resource when available in the simulated distributed computing system without executing the respective operation on the simulated distributed computing system; and
calculating, by the computing device, a time period associated with a simulated execution time of the respective operation.

2. The method of claim 1, wherein simulating comprises:
sending the respective operation to a worker process in a plurality of worker processes, wherein the worker process sends the request for the amount of the resource.

3. The method of claim 2, wherein the plurality of worker processes are arranged in a distributed structure based on the logic associated with executing the algorithm.

4. The method of claim 2, wherein:
the plurality of worker processes are processing multiple portions of an operation or multiple operations in parallel and requesting a respective amount of resources for the multiple portions of the operation or the multiple operations.

5. The method of claim 2, wherein:
a resource manager checks whether the amount of resource is available in the simulated distributed computing system without having to execute the respective operation.

6. The method of claim 1, wherein simulating comprises:
maintaining one or more resource models in the simulated distributed computing system, wherein the one or more resource models are used to determine if the amount of resource used by the respective operation is available for the respective operation.

7. The method of claim 1, wherein simulating comprises:
determining if the amount of resource is available in the simulated distributed computing system;
when the amount of resource is available, reserving the amount of resource in the simulated distributed computing system for the time period; and
when the amount of resource is not available, queuing the respective operation until the amount of resource is available.

8. The method of claim 1, wherein calculating the time period comprises:
using the simulated execution time and any time spent queuing as the time period for executing the respective operation.

9. The method of claim 1, further comprising:
receiving the information from the hardware distributed computing system that executed the algorithm of the application processing the first data set on the set of hardware devices; and training the operation estimator to estimate the number of operations based on the received information; and
training the resource cost estimator to estimate the resource cost for the operations based on the received information.

10. The method of claim 1, wherein generating the simulator driver file comprises:
generating the sequence of operations from the total number of operations; and
distributing the total resource cost across the sequence of operations based on a resource distribution model.

11. The method of claim 10, wherein the resource distribution model is based on the information from the hardware distributed computing system.

12. The method of claim 1, wherein generating the sequence of operations comprises:
generating multiple types of operations in the sequence of operations based on the total number of operations using an execution framework used to execute the algorithm of the application.

13. The method of claim 12, wherein the execution framework executes different types of operations in a set sequence across multiple distributed computing nodes in the simulated distributed computing system.

14. The method of claim 1, wherein the simulated distributed computing system includes a different amount of resources as the hardware distributed computing system.

15. The method of claim 1, wherein the simulated distributed computing system includes a different configuration of resources than the hardware distributed computing system.

16. The method of claim 1, wherein the simulated distributed computing system includes a number of computing node resources, an amount of memory resources, an amount of storage resources, and an amount of network resources.

17. A non-transitory computer-readable storage medium containing instructions, that when executed, control a computer system to be configured for:
receiving a second data set that is different from a first data set;
generating a total number of operations based on the second data set using an operation estimator, wherein the operation estimator was trained using information from a hardware distributed computing system that executed an algorithm of an application processing the first data set on a set of hardware devices;
generating an aggregate resource cost for the total number of operations based on the second data set using a resource cost estimator that was trained using the information from the hardware distributed computing system;
generating a simulation driver file including a sequence of operations from the total number of operations and a resource cost for each operation in the sequence of operations from the aggregate resource cost based on logic associated with executing the algorithm of the application; and
simulating the sequence of operations by performing:
requesting an amount of resource used by a respective operation on a simulated distributed computing system, the amount of the resource based on the resource cost of the respective operation;
reserving the amount of resource when available in the simulated distributed computing system without executing the respective operation on the simulated distributed computing system; and calculating a time period associated with a simulated execution time of the respective operation.

18. A method comprising:
receiving, by a computing device, information from a hardware distributed computing system that is executing an algorithm of an application processes a first data set on a set of hardware devices;
training, by the computing device, an operation estimator to estimate a number of operations and a resource cost estimator to estimate a resource cost for the number of operations based on the received information;
receiving, by the computing device, a second data set that is different from the first data set;
generating, by the computing device, a total number of operations based on the second data set using the operation estimator;
generating, by the computing device, an aggregate resource cost for the total number of operations based on the second data set using the resource cost estimator;
generating, by the computing device, a simulation driver file including a sequence of operations from the total number of operations and a resource cost for each operation in the sequence of operations from the aggregate resource cost; and
simulating, by the computing device, the sequence of operations on a simulated distributed computing system, wherein the simulating uses the resource cost of a respective operation in the second sequence of operations to determine an amount of resource used by the respective operation on the simulated distributed computing system without executing the respective operation on the simulated distributed computing system.

19. The method of claim 18, wherein simulating comprises:
maintaining one or more resource models in the simulated distributed computing system, wherein the one or more resource models are used to determine if the amount of resource used by the respective operation is available for the respective operation.

20. The method of claim 18, wherein simulating comprises:
determining if the amount of resource is available in the simulated distributed computing system;
when the amount of resource is available, reserving the amount of resource in the simulated distributed computing system for the time period; and
when the amount of resource is not available, queuing the respective operation until the amount of resource is available.

* * * * *